United States Patent
Kim et al.

(10) Patent No.: US 9,972,696 B2
(45) Date of Patent: May 15, 2018

(54) ETCHING METHOD AND METHOD OF FABRICATING A SEMICONDUCTOR DEVICE USING THE SAME

(71) Applicant: Samsung Electronics Co., Ltd., Suwon-si (KR)

(72) Inventors: Hoyoung Kim, Hwaseong-si (KR); Sang Won Bae, Suwon-si (KR); Jae-Jik Baek, Seongnam-si (KR); Wonsang Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/229,930

(22) Filed: Aug. 5, 2016

(65) Prior Publication Data

US 2017/0084719 A1 Mar. 23, 2017

(30) Foreign Application Priority Data

Sep. 21, 2015 (KR) .................. 10-2015-0133114

(51) Int. Cl.
*H01L 21/3213* (2006.01)
*H01L 29/66* (2006.01)
*H01L 21/28* (2006.01)
*H01L 21/3205* (2006.01)
*C09K 13/00* (2006.01)

(52) U.S. Cl.
CPC ........ *H01L 29/66545* (2013.01); *C09K 13/00* (2013.01); *H01L 21/28017* (2013.01); *H01L 21/28255* (2013.01); *H01L 21/32055* (2013.01); *H01L 21/32134* (2013.01); *H01L 29/66553* (2013.01); *H01L 29/66795* (2013.01)

(58) Field of Classification Search
None
See application file for complete search history.

(56) References Cited

U.S. PATENT DOCUMENTS

| 5,292,445 | A | 3/1994 | Fjare et al. |
| 5,567,574 | A | 10/1996 | Hasemi et al. |
| 6,833,084 | B2 | 12/2004 | Mercaldi et al. |
| 7,144,817 | B2 | 12/2006 | Samukawa |
| 9,187,659 | B2 | 11/2015 | Shieh et al. |

(Continued)

FOREIGN PATENT DOCUMENTS

| JP | H09-319098 A | 12/1997 |
| JP | 3302120 B2 | 4/2002 |

(Continued)

*Primary Examiner* — Charles Garber
*Assistant Examiner* — Alia Sabur
(74) *Attorney, Agent, or Firm* — Muir Patent Law, PLLC

(57) ABSTRACT

The present disclosure relates to an etchant, a method of making an etchant, an etching method and a method of fabricating a semiconductor device using the same. The etching method includes supplying an etchant on an etch-target layer to etch the etch-target layer in a wet etch manner. The etchant contains a basic compound and a sugar alcohol, and the basic compound contains ammonium hydroxide or tetraalkyl ammonium hydroxide. In the etchant, the sugar alcohol has 0.1 to 10 parts by weight for every 100 parts by weight of the basic compound.

18 Claims, 16 Drawing Sheets

(56) References Cited

U.S. PATENT DOCUMENTS

| | | | |
|---|---|---|---|
| 2007/0000609 A1* | 1/2007 | Tai | C23F 1/08 156/345.18 |
| 2007/0175862 A1 | 8/2007 | Yamada et al. | |
| 2012/0112321 A1 | 5/2012 | Holdermann | |
| 2012/0295447 A1 | 11/2012 | Tamboli et al. | |
| 2013/0196467 A1* | 8/2013 | Chen | H01L 45/06 438/102 |
| 2013/0203263 A1* | 8/2013 | Shimada | H01L 29/66545 438/753 |
| 2014/0001145 A1 | 1/2014 | Mizutani et al. | |
| 2015/0162213 A1 | 6/2015 | Chen et al. | |

FOREIGN PATENT DOCUMENTS

| | | | |
|---|---|---|---|
| JP | 2007214456 A | * | 8/2007 |
| JP | 2010-232486 A | | 10/2010 |
| JP | 5109261 B2 | | 10/2012 |
| JP | 2015-118124 A | | 6/2015 |
| KR | 10-0546152 | | 4/2006 |

* cited by examiner

ETCHING METHOD AND METHOD OF FABRICATING A SEMICONDUCTOR DEVICE USING THE SAME

CROSS-REFERENCE TO RELATED APPLICATIONS

This U.S. non-provisional patent application claims the benefit of priority under 35 U.S.C. § 119 to Korean Patent Application No. 10-2015-0133114, filed on Sep. 21, 2015, in the Korean Intellectual Property Office, the entire contents of which are hereby incorporated by reference.

BACKGROUND

The present disclosure relates to an etching method and a method of fabricating a semiconductor device using the same, and in particular, to a wet etching method for a polysilicon layer and a method of fabricating a semiconductor device using the same.

Due to their small-size, multifunctionality, and/or low-cost characteristics, semiconductor devices are important elements in the electronic industry. Generally, semiconductor devices are classified into a memory device for storing data, a logic device for processing data, and a hybrid device for performing various functions.

As the electronic industry advances, there is an increasing demand for a semiconductor device with a higher integration density and higher performance. To meet such a demand, it is desired to reduce a process margin (for example, in a photolithography process), but although a variety of studies are being conducted to solve the difficulties, the reduction of the process margin may lead to several difficulties in fabricating a semiconductor device.

SUMMARY

Some embodiments of the disclosed concepts include a wet etching method capable of effectively etching a polysilicon layer and a method of fabricating a semiconductor device with high yield, and the resultant semiconductor device. Embodiments also contemplate an etchant and a method of manufacturing an etchant.

According to some embodiments of the disclosed concepts, an etching method may include supplying an etchant on an etch-target layer to etch the etch-target layer in a wet etch manner. The etchant may contain a basic compound and a sugar alcohol, and the basic compound may contain ammonium hydroxide or tetraalkyl ammonium hydroxide. In the etchant, the sugar alcohol may have 0.1 to 10 parts by weight for every 100 parts by weight of the basic compound.

In some embodiments, the etch-target layer may be polysilicon.

In some embodiments, the sugar alcohol may be at least one selected from the group consisting of Sorbitol, Glycerol, Erythritol, Threitol, Arabitol, Xylitol, Ribitol, Mannitol, Galactitol, Fucitol, Iditol, Inositol, Volemitol, Maltitol, Lactitol, Maltotritol, Maltotetraitol, and Polyglycitol.

In some embodiments, the etchant may further contain a compound that has 0.1 to 10 parts by weight for every 100 parts by weight of the basic compound and is represented by the following chemical formula 1:

[Chemical Formula 1]

where $R_1$ is selected from the group consisting of a C1-C10 alkyl group and a C6-C8 aryl group, and each of $R_2$ and $R_3$ is independently selected from the group consisting of hydrogen, a C1-C10 alkyl group, and a C6-C8 aryl group.

In some embodiments, the etchant may be prepared by mixing the basic compound with the sugar alcohol to prepare an etchant mixture and mixing the etchant mixture with water of 60-100° C.

According to some embodiments of the disclosed concepts, a method of fabricating a semiconductor device may include forming device isolation layers on a substrate to define an active pattern, forming a sacrificial gate pattern to cross the active pattern, and replacing the sacrificial gate pattern with a gate electrode. The replacing of the sacrificial gate pattern with the gate electrode may include supplying an etchant on the sacrificial gate pattern to etch the sacrificial gate pattern in a wet etch manner. Here, the etchant may contain a basic compound, a sugar alcohol, and a compound represented by the following chemical formula 1, and the basic compound may contain ammonium hydroxide or tetraalkyl ammonium hydroxide.

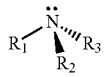

[Chemical Formula 1]

where $R_1$ is selected from the group consisting of a C1-C10 alkyl group and a C6-C8 aryl group, and each of $R_2$ and $R_3$ is independently selected from the group consisting of hydrogen, a C1-C10 alkyl group, and a C6-C8 aryl group.

In some embodiments, the sacrificial gate pattern may include polysilicon.

In some embodiments, in the etchant, for every 100 parts by weight of the basic compound, the sugar alcohol may have 0.1 to 10 parts by weight and the compound of the chemical formula 1 may have 0.1 to 10 parts by weight.

In some embodiments, the etchant may have a pH value ranging from 12 to 14.

In some embodiments, the tetraalkyl ammonium hydroxide may be at least one selected from the group consisting of Tetramethylammonium Hydroxide (TMAH), Tetraethylammonium Hydroxide (TEAH), and Tetrabuthylammonium Hydroxide (TBAH).

In some embodiments, the sugar alcohol may be at least one selected from the group consisting of Sorbitol, Glycerol, Erythritol, Threitol, Arabitol, Xylitol, Ribitol, Mannitol, Galactitol, Fucitol, Iditol, Inositol, Volemitol, Maltitol, Lactitol, Maltotritol, Maltotetraitol, and Polyglycitol.

In some embodiments, in the chemical formula 1, R1 may be the C1-C10 alkyl group and each of R2 and R3 may be hydrogen.

In some embodiments, the method may further include forming a pair of spacers to cover both sidewalls of the sacrificial gate pattern and forming an interlayered insulating layer to cover the active pattern and the spacers. The replacing of the sacrificial gate pattern with the gate electrode may further include performing a wet etching process on the sacrificial gate pattern to form a gate trench defined by the spacers and forming a gate electrode to fill the gate trench.

In some embodiments, the method may further include forming source/drain regions in portions of the active pattern at both sides of the sacrificial gate pattern, before the forming the interlayered insulating layer. The etchant may be prepared to allow the sacrificial gate pattern, but not the source/drain regions, to be selectively etched.

In some embodiments, the active pattern may include an active fin protruding between the device isolation layers.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
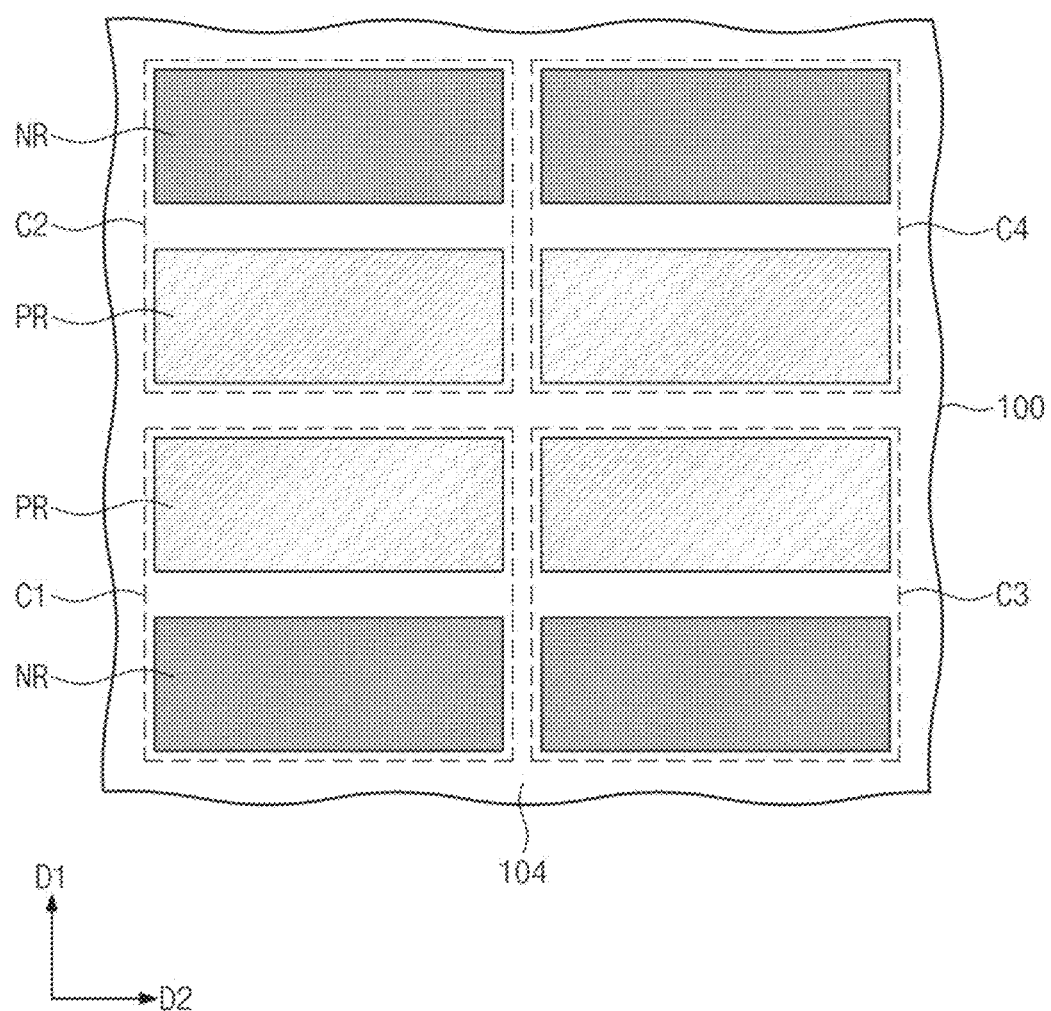
FIG. 1 is a plan view of a semiconductor device, according to some exemplary embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the concepts are shown. The concepts and methods of achieving them will be apparent from the following exemplary embodiments that will be described in more detail with reference to the accompanying drawings. The embodiments o may, however, be embodied in different forms and should not be constructed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

The terminology used herein is for the purpose of describing certain embodiments only and is not intended to be limiting of example embodiments. As used herein, the singular terms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

It will be understood that when an element such as, for example, a layer, region or substrate is referred to as being "on," "connected to," "electrically connected to," or "coupled to" another element, it can be directly on, connected to, or coupled to the other element or intervening elements may be present. In contrast, when an element is referred to as being "directly on," "directly connected to," "directly electrically connected to," or "directly coupled to" another component, or as "contacting" or "in contact with" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items. Additionally, the embodiments in the detailed description will be described with sectional views as ideal exemplary views of the concepts. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes.

It will be understood that, although the terms "first", "second", etc. may be used herein to describe various elements, components, regions, layers and/or sections, these elements, components, regions, layers and/or sections should not be limited by these terms. Unless the text indicates otherwise, these terms are only used to distinguish one element, component, region, layer or section from another element, component, region, layer or section. For example, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to limit the scope of the example embodiments.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Unless otherwise defined, all terms (including technical and scientific terms) used herein have the same meaning as commonly understood by one of ordinary skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

The semiconductor devices described herein embodied as an electronic device, such as a semiconductor memory chip or semiconductor logic chip, a stack of such chips, a semiconductor package including a package substrate and one or more semiconductor chips, a package-on-package device, or a semiconductor memory module, for example. The semiconductor devices described herein may be embodied as a volatile or non-volatile memory. A chip or package that includes such semiconductor devices may also be referred to generally as a semiconductor device.

Exemplary embodiments of aspects of the present disclosure explained and illustrated herein include their complementary counterparts. The same reference numerals or the same reference designators denote the same elements throughout the specification.

FIG. 1 is a plan view of a semiconductor device, according to some exemplary embodiments.

Referring to FIG. 1, a semiconductor device according to some exemplary embodiments may include a plurality of logic cells C1, C2, C3, and C4 provided on a substrate 100. Each of the logic cells C1, C2, C3, and C4 may include a plurality of transistors. As an example, the exemplary semiconductor device illustrated in FIG. 1 includes a first logic cell C1, a second logic cell C2 spaced apart from the first logic cell C1 in a first direction D1, a third logic cell C3 spaced apart from the first logic cell C1 in a second direction D2 across the first direction D1, and a fourth logic cell C4 spaced apart from the second logic cell C2 in the second direction D2. Each of the logic cells C1, C2, C3, and C4 may include active regions spaced apart from each other by device isolation layer 104. Each of the logic cells C1, C2, C3, and C4 may include a p-type metal oxide semiconductor field effect transistor (PMOSFET) region PR and an n-type MOSFET (NMOSFET) region NR which are spaced apart from each other by the device isolation layer 104.

As an example, the PMOSFET and NMOSFET regions PR and NR may be spaced apart from each other in the first direction D1. The PMOSFET region PR of the first logic cell C1 may be disposed adjacent to the PMOSFET region PR of the second logic cell C2 in the first direction D1, and the PMOSFET region PR of the first logic cell C1 may be disposed adjacent to the PMOSFET region PR of the third logic cell C3 in the second direction D2. Additionally, the NMOSFET region NR of the first logic cell C1 may be disposed adjacent to the NMOSFET region NR of the third logic cell C3 in the second direction, and the NMOSFET region NR of the second logic cell C2 may be disposed adjacent to the NMOSFET region NR of the fourth logic cell C4 in the second direction. As used herein, the term "logic cell" may refer to a unit circuit configured to perform a single logical operation and be composed of a plurality of interconnected MOSFETs. Examples of logic cells include a NAND gate, a NOR gate, an inverter, and a latch. Further, the number of the logic cells may be variously changed from that illustrated in the drawing.

Figure 2:
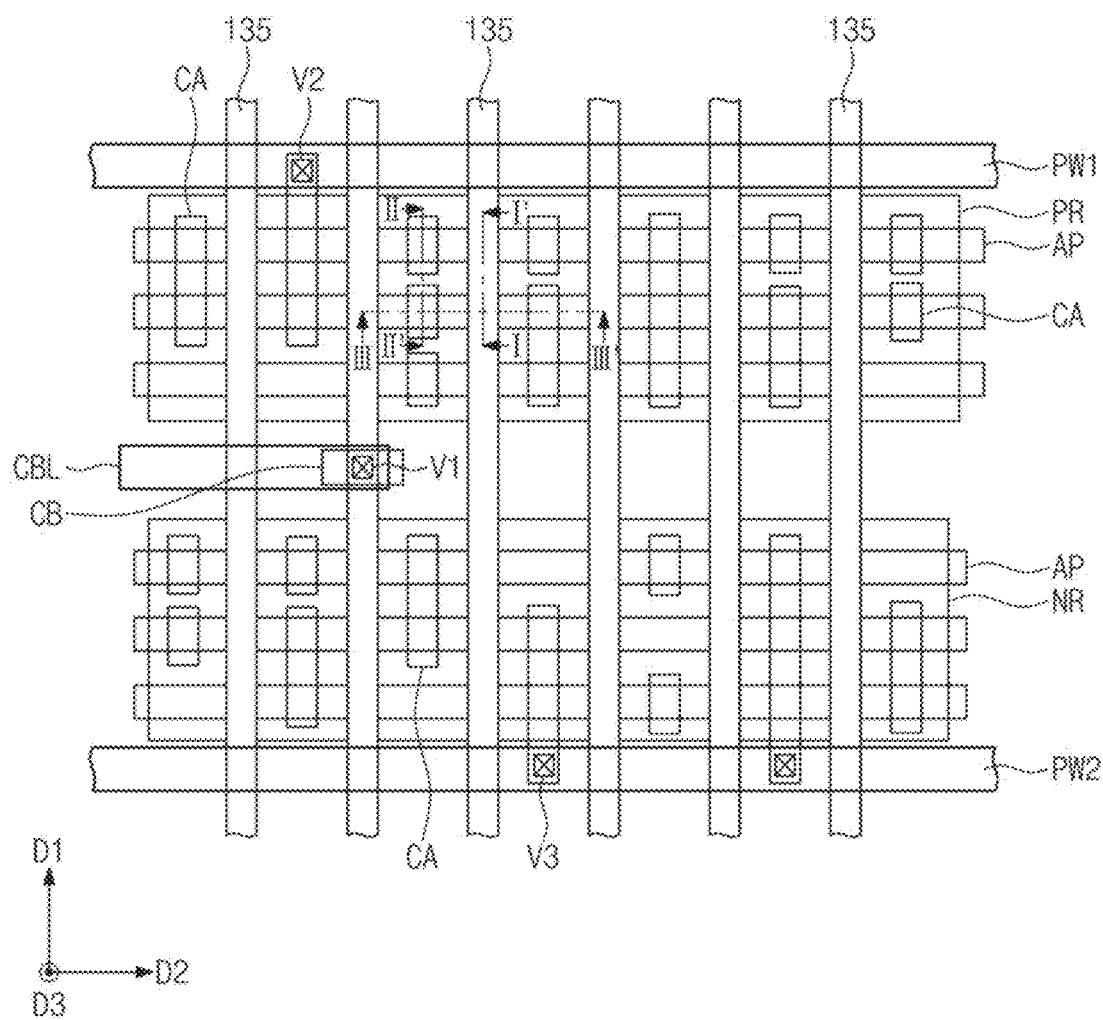
FIG. 2 is a plan view illustrating a portion of a semiconductor device, according to some exemplary embodiments.
Figure 3A:
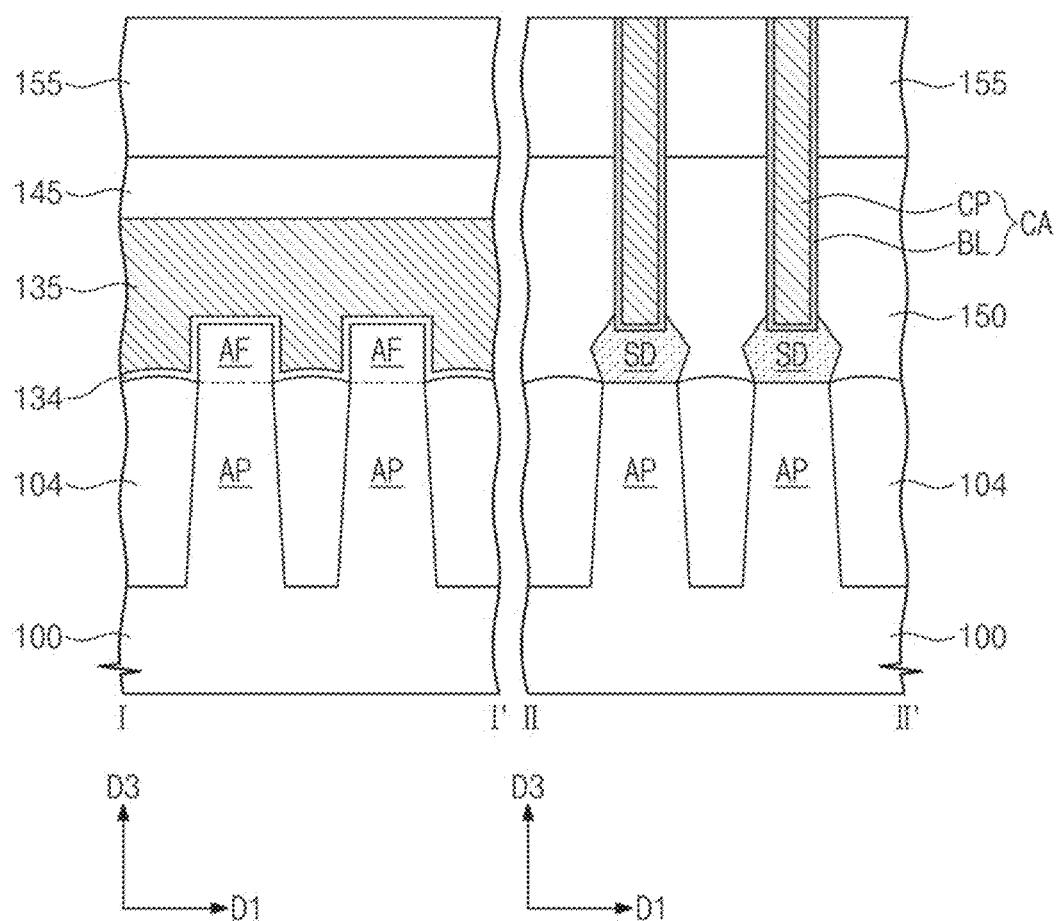
FIG. 3A is a sectional view taken along lines I-I' and II-II' of FIG. 2, according to certain exemplary embodiments.
Figure 3B:
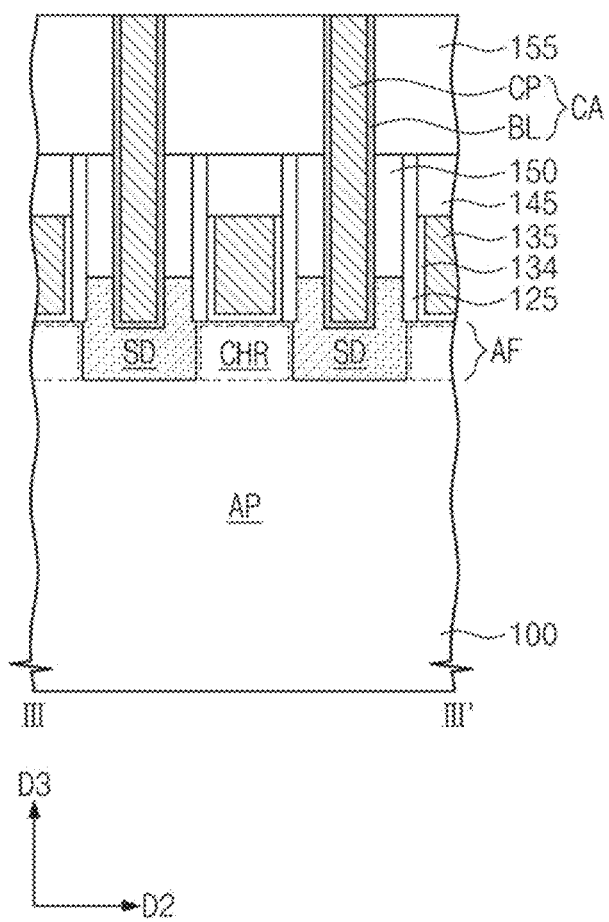
FIG. 3B is a sectional view taken along line III-III' of FIG. 2, according to certain exemplary embodiments.

FIG. 2 is a plan view illustrating a portion of a semiconductor device according to some exemplary embodiments. For example, FIG. 2 is an exemplary plan view illustrating the first logic cell C1 of FIG. 1. Hereinafter, various embodiments will be described with reference to the first logic cell C1 of FIG. 1, but the others of the logic cells C2, C3, and C4 may have the same or similar structure as that of the first logic cell C1. In addition, it will be apparent that the invention is not limited to one or a plurality of logic cells, but may be implemented in connection with one or more transistors, a portion of a transistor, an integrated circuit (e.g., comprising a plurality of interconnected logic cell), a semiconductor chip, a plurality of semiconductor chips (e.g., stacked in a package), etc. FIG. 3A is an exemplary sectional view taken along lines I-I' and II-II' of FIG. 2. FIG. 3B is an exemplary sectional view taken along line III-III' of FIG. 2.

Referring to FIGS. 2, 3A, and 3B, the device isolation layer 104 may be provided on the substrate 100 to define the PMOSFET and NMOSFET regions PR and NR. The device isolation layer 104 may be formed in a top portion of the substrate 100. In some embodiments, the device isolation layer 104 may include an insulating material, such as, for example, silicon oxide.

The PMOSFET and NMOSFET regions PR and NR may be spaced apart from each other (here, spaced in the first direction D1 parallel to a top surface of the substrate 100) by one or more device isolation layer 104 that is/are interposed therebetween. Although each of the PMOSFET and NMOSFET regions PR and NR is illustrated to be a single region, it may include a plurality of regions spaced apart from each other by the device isolation layer 104.

A plurality of active patterns AP may be provided on the PMOSFET and NMOSFET regions PR and NR to extend in the second direction D2 across the first direction D1. For example, the plurality of active patterns AP may be arranged along the first direction D1. The plurality of active patterns AP may have a first conductivity type. The device isolation layer 104 may be provided at both sides of each of the active patterns AP to define the active patterns AP. For example, the device isolation layer 104 may be formed between each of the plurality of active patterns AP. Although the number of the active patterns AP provided on each of the PMOSFET and NMOSFET regions PR and NR is shown to be three, some embodiments may not be limited thereto. For example, the number of active patterns AP provided on each of the PMOSFET and NMOSFET regions PR and NR may be greater or fewer than that illustrated.

Each of the active patterns AP may include active fins AF protruding above the active patterns AP formed between the device isolation layer 104. For example, each of the active fins AF may have a structure protruding from the active pattern AP in a third direction D3 perpendicular to the top surface of the substrate 100. Each of the active fins AF may include source/drain regions SD and a channel region CHR interposed between the source/drain regions SD, as illustrated in FIG. 3B.

Gate electrodes 135 may be provided on the substrate 100 to cross the plurality of active patterns AP. The gate electrodes 135 may be overlapped with the channel regions CHR of the active fins AF, respectively, when viewed in a plan view. For example, each of the gate electrodes 135 may be provided to cross the plurality of active fins AF, extending parallel to the first direction D1. In some embodiments, the gate electrodes 135 may be line-shaped structures.

Gate spacers 125 may be provided on both sidewalls of each of the gate electrode 135. For example, the gate spacers 125 may be adjacent to the sidewalls of each of the gate electrodes 135. The gate spacers 125 may extend along the sidewalls of the gate electrodes 135 or in the first direction D1. A top surface of each of the gate spacers 125 may be positioned at a higher level than that of a corresponding one of the gate electrodes 135. Furthermore, the top surface of each of the gate spacers 125 may be coplanar with that of a first interlayered insulating layer 150, which will be described below. The gate spacers 125 may include at least one of SiO2, SiCN, SiCON, or SiN. In some embodiments, the gate spacers 125 may have a multi-layer structure including at least one of $SiO_2$, SiCN, SiCON, or SiN.

Gate dielectric layers 134 may be respectively provided between the gate electrodes 135 and the substrate 100 and between the gate electrodes 135 and the gate spacers 125. Each of the gate dielectric layers 134 may extend along a bottom surface of the gate electrode 135. Accordingly, the gate dielectric layers 134 may cover top and side surfaces of the channel regions CHR. The gate dielectric layers 134 may extend horizontally from the active fins AF to partially cover top surfaces of the device isolation layer 104. In some embodiments, the gate dielectric layers 134 may be provided to leave portions of the top surfaces of the device isolation layer 104 exposed. The exposed portions of the top surfaces of the device isolation layer 104 may be covered with the first interlayered insulating layer 150.

The gate dielectric layers 134 may be formed of or include a high-k dielectric material. For example, the gate dielectric layers 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Gate capping layers 145 may be disposed on the gate electrodes 135, respectively. For example, each of the gate electrodes 135 may have a gate capping layer 145 disposed thereon. The gate capping layers 145 may extend along the gate electrodes 135 in the first direction D1. The gate capping layers 145 may include a material having an etch selectivity with respect to the first and second interlayered insulating layers 150 and 155, which will be described below. For example, the gate capping layers 145 may include at least one of SiON, SiCN, SiCON, or SiN.

The source/drain regions SD may be provided on or in the active fins AF and at both sides of each of the gate structures GS (in this example, a gate structure GS may comprise a gate dielectic layer 134, a gate electrode 135, a gate capping layer 145 and gate spacers 125 formed on either side thereof). For example, the source/drain regions SD may be disposed on both sides of the channel regions CHR. The source/drain regions SD may be epitaxial patterns, which are epitaxially grown from the active patterns AP. In some embodiments, when viewed in a vertical section, top surfaces of the channel regions CHR may be positioned at a higher level than bottom surfaces of the source/drain regions SD. In certain embodiments, top surfaces of the source/drain regions SD may be positioned at the same level as, or a higher level than, the top surfaces of the channel regions CHR.

The source/drain regions SD may include a semiconductor element different from those of the substrate 100. For example, the source/drain regions SD may be formed of or include a semiconductor material having a lattice constant different from (e.g., greater or smaller than) the substrate 100. This may make it possible to exert a compressive stress or a tensile stress to the channel regions CHR. In embodiments where the substrate 100 is a silicon wafer, the source/drain regions SD may be formed of or include a silicon-germanium (e.g., e-SiGe) or germanium layer. In this case, the source/drain regions SD may exert a compressive stress on the channel regions CHR (preferably, of PMOS field effect transistors). In the case where the substrate 100 is a silicon wafer, the source/drain regions SD may be formed of or include a silicon carbide (SiC) layer. In this case, the source/drain regions SD may exert a tensile stress on the channel regions CHR (preferably, of NMOS field effect transistors). The compressive or tensile stresses to be exerted on the channel regions CHR by the source/drain regions SD may make it possible for carriers in the channel regions CHR to have an increased mobility when the field effect transistors are operated. The source/drain regions SD may be doped to have a second conductivity type that is different from that of the active pattern AP.

In certain embodiments, although not shown, the source/drain regions SD may be doped regions, which are formed in the active patterns AP and are doped to have the second conductivity type. In this exemplary embodiment, the source/drain regions SD may contain the same semiconductor element as that of the substrate 100.

A first interlayered insulating layer 150 may be provided on the substrate 100. In some embodiments, the device isolation layer 104 may be disposed between the first interlayered insulating layer 150 and the substrate 100. The first interlayered insulating layer 150 may be provided to cover the source/drain regions SD and sidewalls of the gate structures GS. The first interlayered insulating layer 150 may have a top surface that is coplanar with those of the gate structures GS. A second interlayered insulating layer 155 may be formed on the first interlayered insulating layer 150 to cover the gate structures GS.

In addition, contacts CA may be provided at both sides of each of the gate electrodes 135 and may be electrically connected to the source/drain regions SD through the first and second interlayered insulating layers 150 and 155. For example, contacts CA may extend through the first and second interlayered insulating layers 150 and 155 and extend into the source/drain regions SD on each side of the gate electrodes 134. Each of the contacts CA may be connected to a corresponding one or ones of the source/drain regions SD, but some embodiments of the inventive concept may not be limited thereto. Each of the contacts CA may include a conductive pillar CP and a contact barrier layer BL that encloses the conductive pillar CP. The contact barrier layer BL may be provided to cover side and bottom surfaces of the conductive pillar CP. The conductive pillar CP may be formed of or include a metallic material (e.g., tungsten). The contact barrier layer BL may be formed of or include at least one of metal nitrides (e.g., Ti/TiN).

Although not shown, metal silicide layers may be respectively interposed between the source/drain regions SD and the contacts CA. For example, the contacts CA may be electrically connected to the source/drain regions SD through the metal silicide layers. The metal silicide layers may be formed of or include at least one of metal-silicide materials (e.g., titanium silicide, tantalum silicide, tungsten silicide, etc.).

A gate contact CB and a conductive line CBL may be provided on one of the gate electrodes 135. A first via V1 may be disposed between the gate contact CB and the conductive line CBL. The conductive line CBL may be electrically connected to the one of the gate electrodes 135 through the first via V1 and the gate contact CB to serve as a current path for applying signals to the one of the gate electrodes 135.

The first logic cell C1 may include a first wire PW1 provided near an outer edge of the PMOSFET region PR and a second wire PW2 provided near an outer edge of the NMOSFET region NR. As an example, the first wire PW1 on the PMOSFET region PR may serve as a current path for transmitting a drain voltage Vdd (e.g., a power voltage). The second wire PW2 on the NMOSFET region NR may serve as a current path for transmitting a source voltage Vss (e.g., a ground voltage).

Referring back to FIGS. 1 and 2, the first and second wires PW1 and PW2 may extend in the second direction D2 and may be shared by a plurality of logic cells disposed adjacent to each other in the second direction D2. As an example, the first wire PW1 may be shared by the PMOSFET regions PR of the first logic cell C1 and the third logic cell C3. Furthermore, the first wire PW1 may be shared by the PMOSFET regions PR of the first and second logic cells C1 and C2, and the first wire PW1 may be shared by the PMOSFET regions PR of the second logic cell C2 and the fourth logic cell C4. As another example, the second wire PW2 may be shared by the NMOSFET regions NR of the first logic cell C1 and the third logic cell C3. Furthermore, the second wire PW2 may be shared by the NMOSFET regions NR of the first and second logic cells C1 and C2, and the second wire PW2 may be shared by the NMOSFET regions NR of the second logic cell C2 and the fourth logic cell C4.

In some embodiments, a second via V2 may be provided on one of the contacts CA. Accordingly, the source/drain region SD connected to the one of the contacts CA may be electrically connected to the first wire PW1 through the one of the contacts CA and the second via V2. Similarly, a third via V3 may be provided on one of the contacts CA, and the source/drain region SD on the NMOSFET region NR may be electrically connected to the second wire PW2 through one of the contacts CA and the third via V3.

Figure 8:
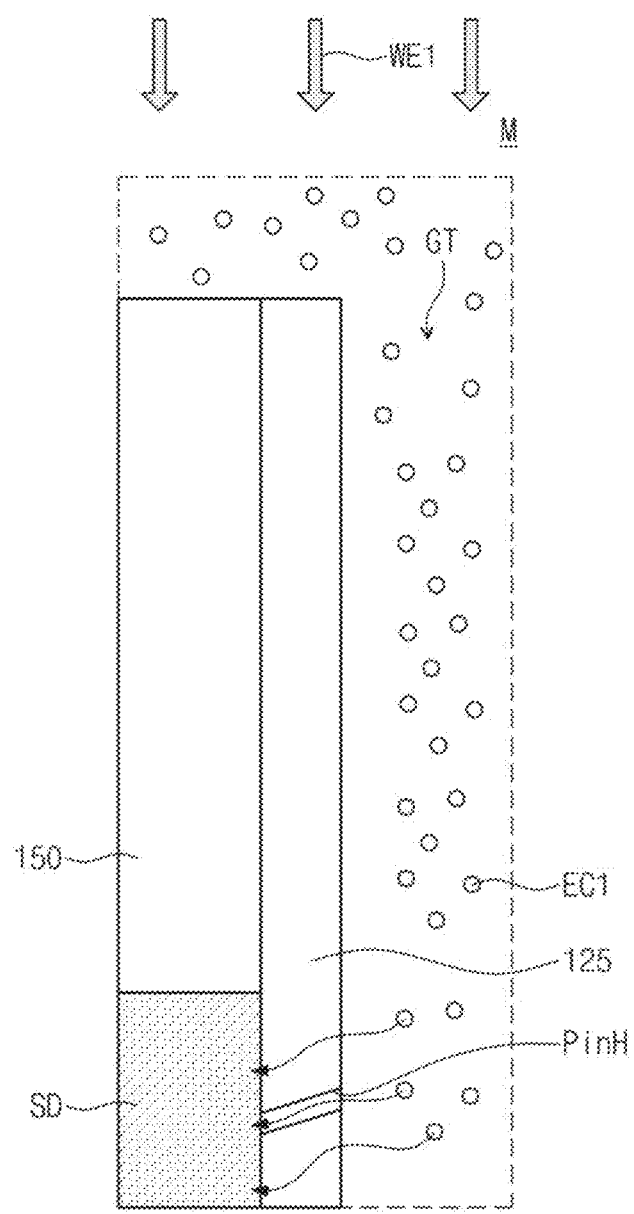
FIG. 8 is an enlarged view illustrating a region 'M' of FIG. 7B, when a wet etching process is performed on a sacrificial gate pattern, consistent with certain exemplary embodiments.
Figure 9:
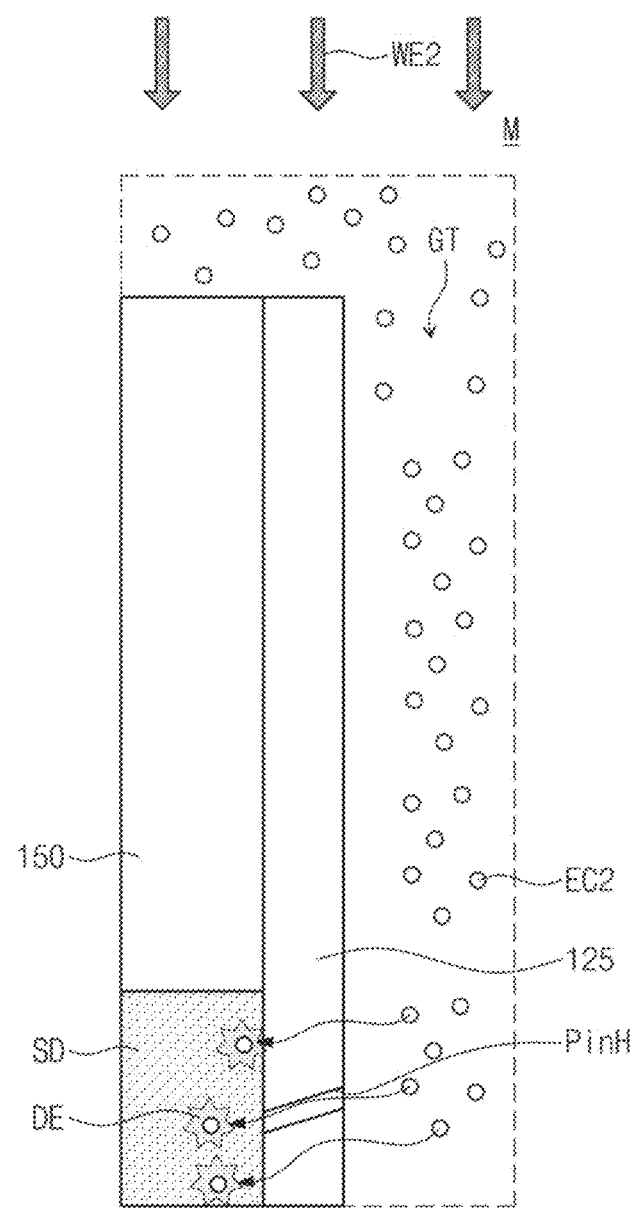
FIG. 9 is an enlarged view illustrating a region 'M' of FIG. 7B, when a wet etching process is performed on a sacrificial gate pattern, consistent with certain exemplary embodiments.

FIGS. 4A, 5A, 6A, 7A, 10A, and 11A are sectional views, which illustrate a method of fabricating a semiconductor device, according to some exemplary embodiments, each of which shows vertical sections taken along lines I-I' and II-II' of FIG. 2. FIGS. 4B, 5B, 6B, 7B, 10B, and 11B are sectional views, which illustrate a method of fabricating a semiconductor device, according to some exemplary embodiments, each of which shows a vertical section taken along line III-III' of FIG. 2. FIG. 8 is an enlarged view illustrating a region 'M' of FIG. 7B, when a wet etching process according to some exemplary embodiments is performed on a sacrificial gate pattern. FIG. 9 is an enlarged view illustrating a region 'M' of FIG. 7B, when a wet etching process according to a comparative example is performed on a sacrificial gate pattern.

Figure 4A:
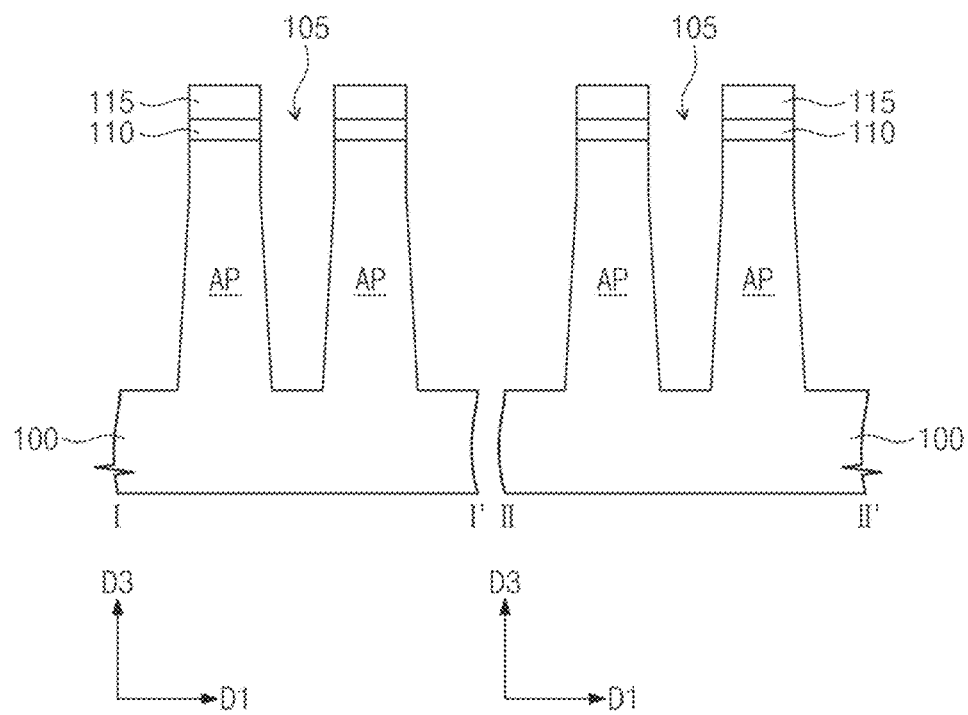
FIGS. 4A, 5A, 6A, 7A, 10A, and 11A are sectional views, which illustrate a method of fabricating a semiconductor device, according to some exemplary embodiments, each of which shows vertical sections taken along lines I-I' and II-II' of FIG. 2.
Figure 4B:
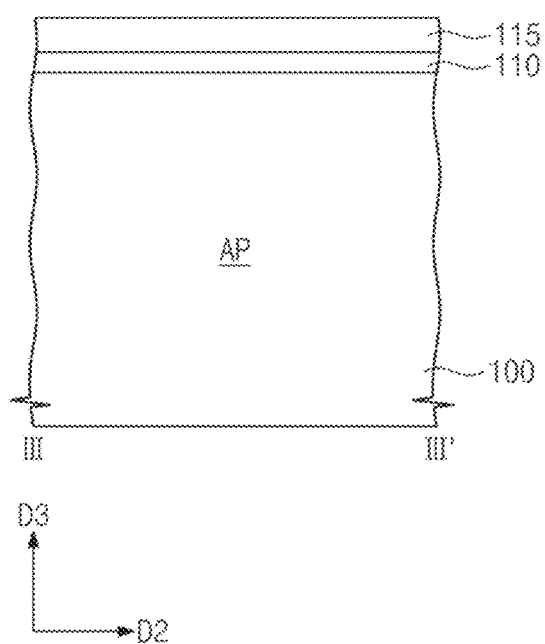
FIGS. 4B, 5B, 6B, 7B, 10B, and 11B are sectional views, which illustrate a method of fabricating a semiconductor device, according to some exemplary embodiments, each of which shows a vertical section taken along line III-III' of FIG. 2.

Referring to FIGS. 2, 4A, and 4B, the substrate 100 may be patterned to form device isolation trenches 105 defining the active patterns AP. The substrate 100 may be a semiconductor substrate (e.g., silicon, germanium, silicon-germanium, etc.) or a compound semiconductor substrate. The active patterns AP may be doped with dopants to have a first conductivity type.

The formation of the device isolation trenches 105 may include forming mask patterns on the substrate 100 and anisotropically etching the substrate 100 using the mask patterns as an etch mask. Each of the mask patterns may include a first mask pattern 110 and a second mask pattern 115, which are sequentially stacked on the substrate 100 and are formed to have an etch selectivity with respect to each other. For example, the first mask pattern 115 may be formed on the substrate 100, and the second mask pattern 115 may be formed on the first mask pattern 110. In some embodiments, each of the device isolation trenches 105 may be formed to have a downward tapered shape. Accordingly, each of the active patterns AP may be formed to have an upward tapered shape. Each of the device isolation trenches 105 may be formed to have an aspect ratio of at least 5. For example, each of the device isolation trenches 105 may have a depth that is at least five times its width, where the depth is the distance from the bottom of the device isolation trench 105 to the bottom surface of the first mask pattern 110 and the width is the distance between sidewalls of adjacent ones of the active patterns AP defining the trench. When the isolation trench 105 has a tapered shape, this width may be measured as the smallest distance between sidewalls of the active patterns AP.

Figure 5A:
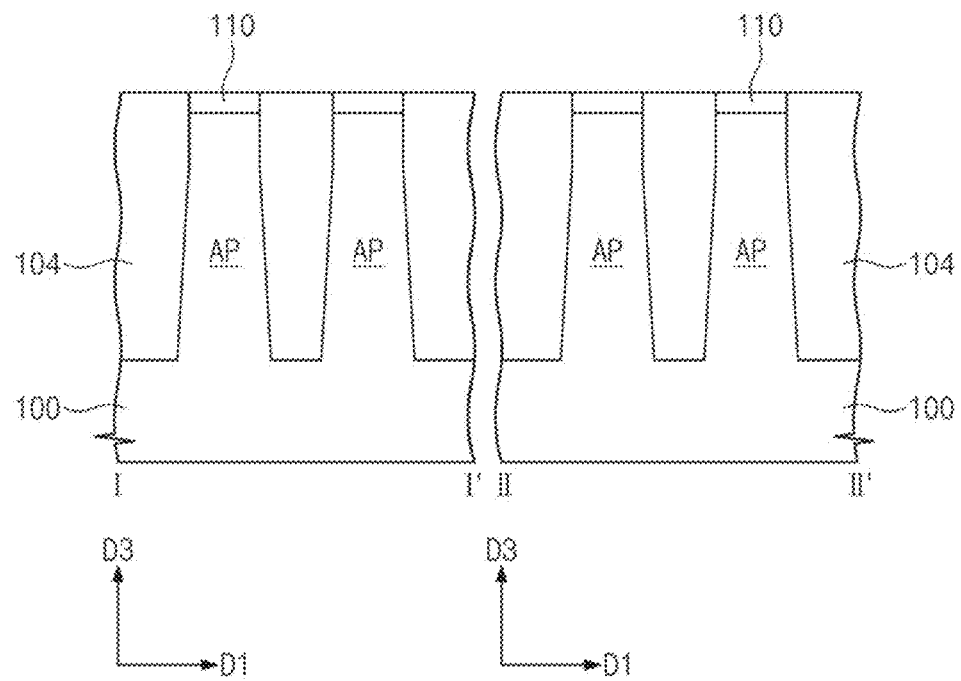
Figure 5B:
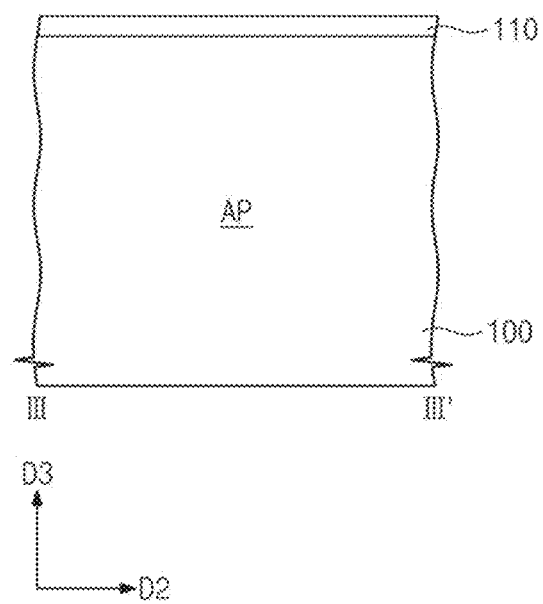

Referring to FIGS. 2, 5A, and 5B, the device isolation layer 104 may be formed to fill the device isolation trenches 105. The formation of the device isolation layer 104 may include forming an insulating layer (e.g., a silicon oxide layer) to fill the device isolation trenches 105 and planarizing the insulating layer to expose the top surface of the first mask pattern 110. As a result of the planarization process, the device isolation layer 104 may be formed as a plurality of discrete locally formed isolation layers 104 in the device isolation trenches 105. For example, after the planarization process is performed, one or more portions of the device isolation layer 104 may be physically separate from one another. For ease of description, the description herein refers to an isolation layer 104 in the singular.

Figure 6A:
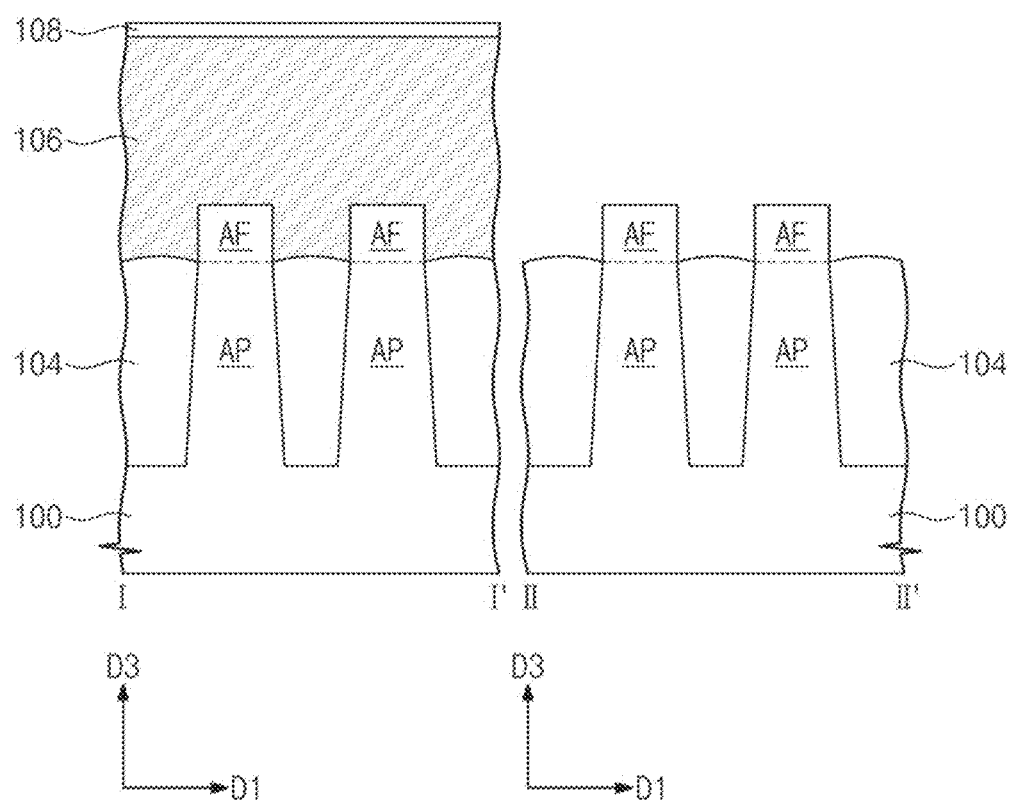
Figure 6B:
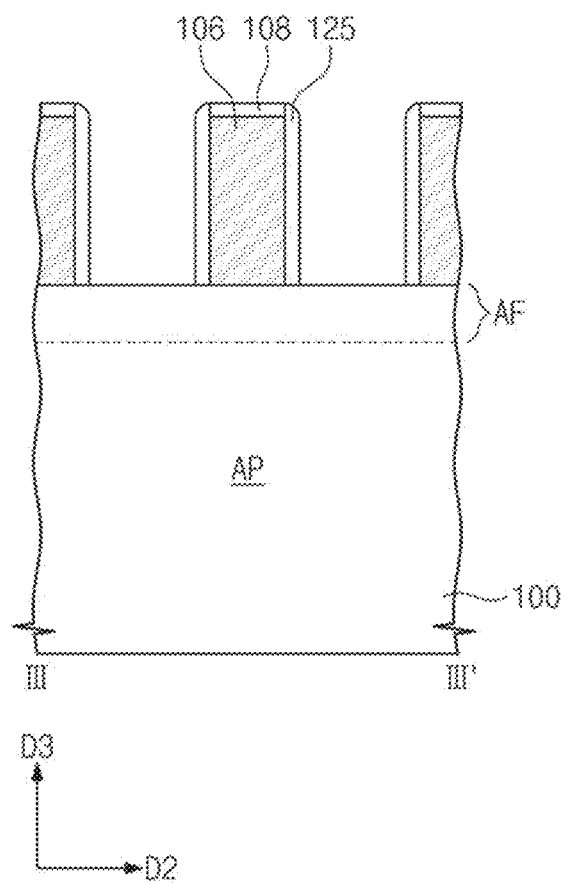

Referring to FIGS. 2, 6A, and 6B, top portions (hereinafter, active fins AF) of the active patterns AP may be exposed. The exposing of the active fins AF may include, for example, recessing top portions of the device isolation layer 104 using a wet etching process. The recessing of the device isolation layer 104 may be performed using an etch recipe having an etch selectivity with respect to the active patterns AP. The recessing of the device isolation layer 104 may be performed to remove the first mask pattern 110 and thereby to expose top surfaces of the active fins AF.

Sacrificial gate patterns 106 and gate mask patterns 108, which are sequentially stacked, may be formed on the active fins AF. For example, the sacrificial gate patterns 106 may be stacked on the device isolation layer 104, and the gate mask patterns 108 may be stacked on the sacrificial gate patterns 106. Each of the sacrificial gate patterns 106 and the gate mask patterns 108 may be formed to cross the active fins AF or to have a line- or bar-shaped structure extending in the first direction D1. For example, the formation of the sacrificial gate patterns 106 and the gate mask patterns 108 may include sequentially forming a sacrificial gate layer (not shown) and a gate mask layer (not shown) on the active fins AF and the device isolation layer 104, and patterning the sacrificial gate layer and the sacrificial mask layer. The sacrificial gate layer may be formed of or include a polysilicon layer. The gate mask layer may be formed of or include a silicon nitride layer or a silicon oxynitride layer.

The gate spacers 125 may be formed on both sidewalls of each of the sacrificial gate patterns 106, and extend in the first direction D1. The formation of the gate spacers 125 may include conformally forming a spacer layer on the resulting structure provided with the sacrificial gate pattern 106 and anisotropically etching the spacer layer. The spacer layer may be formed of or include at least one of $SiO_2$, SiCN, SiCON, or SiN. In some embodiments, the spacer layer may be formed to have a multi-layer structure including at least one of $SiO_2$, SiCN, SiCON, or SiN.

Figure 7A:
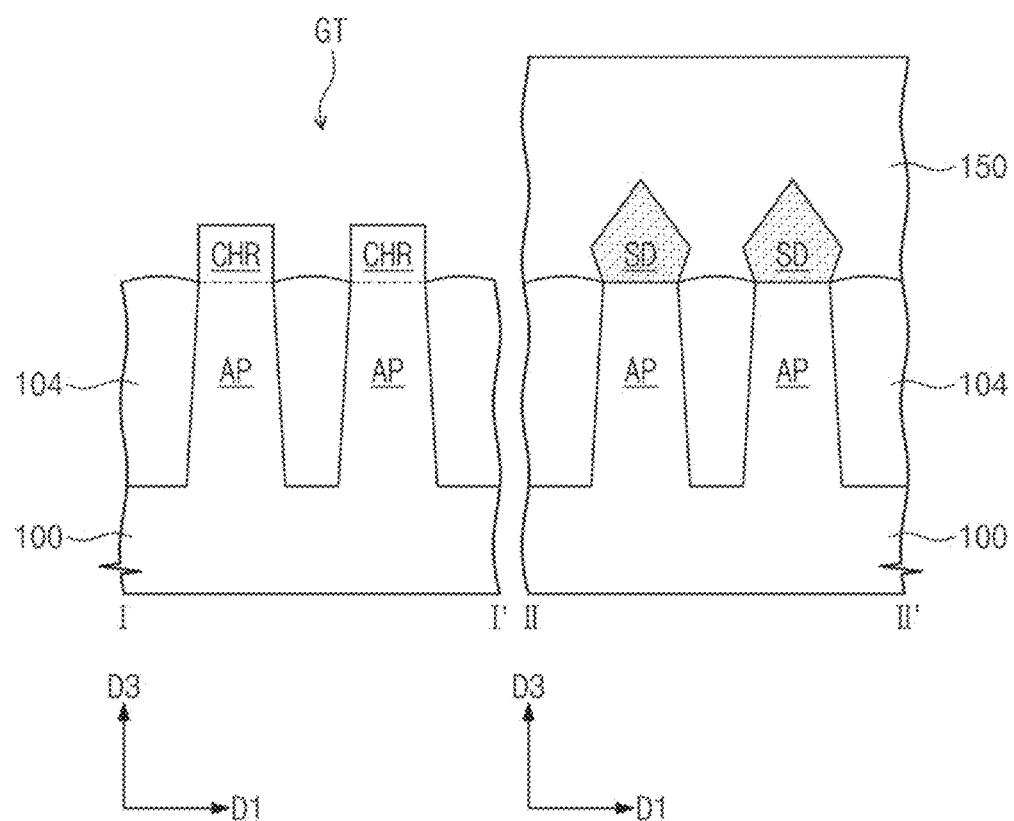
Figure 7B:
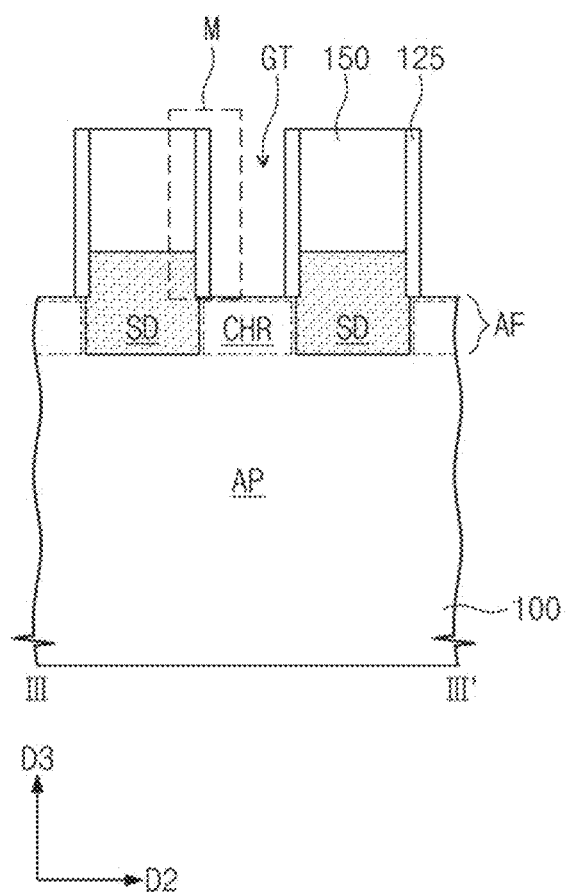

Referring to FIGS. 2, 7A, and 7B, the source/drain regions SD may be formed at both sides of each of the sacrificial gate patterns 106. For example, the source/drain regions SD may be formed by a selective epitaxial growth process using the substrate 100 as a seed layer. The selective epitaxial growth process may include, for example, a chemical vapor deposition (CVD) process or a molecular beam epitaxy (MBE) process. In some embodiments, the active fins AF may be selectively etched using the gate mask patterns 108 and the gate spacers 125 as an etch mask. After the etching of the active fins AF, an epitaxial process, in which the exposed top portions of the active patterns AP are used as a seed layer, may be performed to form the source/drain regions SD. As a result of the formation of the source/drain regions SD, the channel regions CHR may be defined between the source/drain regions SD.

The source/drain regions SD may include a semiconductor element different from those of the substrate 100. For example, the source/drain regions SD may be formed of or include a semiconductor material having a lattice constant different from (e.g., greater or smaller than) the substrate 100. The source/drain regions SD may be doped to have a second conductivity type that is different from the first conductivity type of the active patterns AP. As an example, dopants may be injected in an in-situ manner to realize the second conductivity type of the source/drain regions SD. As another example, after the formation of the source/drain regions SD, an ion implantation process may be performed to realize the second conductivity type of the source/drain regions SD.

In certain embodiments, although not shown, the source/drain regions SD may be formed by injecting dopants of the second conductivity type into the active fins AF using the gate mask patterns 108 and the gate spacers 125 as a mask. For example, each of the source/drain regions SD may be the second conductivity type doped regions which are formed in the active pattern AP. In some embodiments, the source/drain regions SD may contain the same semiconductor element as that of the substrate 100.

Next, the first interlayered insulating layer 150 may be formed to cover the source/drain regions SD. For example, the formation of the first interlayered insulating layer 150 may include forming an insulating layer on the substrate 100 to cover the sacrificial gate patterns 106 and the gate mask patterns 108. The first interlayered insulating layer 150 may include a silicon oxide layer, which may be formed by a flowable chemical vapor deposition (FCVD) process.

Thereafter, the first interlayered insulating layer 150 may be planarized to expose the top surfaces of the sacrificial gate patterns 106. The planarization of the first interlayered insulating layer 150 may be performed using, for example, an etch-back process or a chemical-mechanical polishing (CMP) process. The planarization of the first interlayered insulating layer 150 may be performed to remove the gate mask patterns 108 and thereby to expose the top surfaces of the sacrificial gate patterns 106. Also, the planarization of the first interlayered insulating layer 150 may be performed to remove upper portions of the gate spacers 125. As a result, the first interlayered insulating layer 150 may have a top surface that is coplanar with those of the sacrificial gate patterns 106 and the gate spacers 125.

The sacrificial gate patterns 106 may be removed, and thus, gate trenches GT may be formed. The channel regions CHR of the active fins AF may be exposed by the gate trenches GT. For example, the bottom of the gate trenches GT may be defined by the top surfaces of the channel regions CHR of the active fins AF. Hereinafter, an example in which a wet etching process according to some embodiments is performed on the sacrificial gate patterns 106 will be described in more detail with reference to FIG. 8.

Referring to FIG. 8, a first wet etching process WE1 may be performed on the exposed portions of the sacrificial gate patterns 106. The first wet etching process WE1 may be performed to selectively etch the sacrificial gate patterns 106 and to suppress or prevent the gate spacers 125, the first interlayered insulating layer 150, the channel regions CHR, and the source/drain regions SD from being etched.

For example, the first wet etching process WE1 may include providing a first etchant EC1 on the sacrificial gate patterns 106. The first etchant EC1 may be selected to allow the sacrificial gate patterns 106 (e.g., polysilicon) to be selectively etched by a wet etching process therewith. The first etchant EC1 may contain a basic compound and a sugar alcohol.

The basic compound may allow the first etchant EC1 therewith to be strongly basic (e.g., pH 12-pH 14). In the case where the first etchant EC1 is strongly basic, polysilicon may be easily etched using the first etchant EC1. In some embodiments, the basic compound may contain ammonium hydroxide ($NH_4OH$) or tetraalkyl ammonium hydroxide.

The tetraalkyl ammonium hydroxide may contain alkyl groups whose carbon number ranges from 1 to 10. As an example, the tetraalkyl ammonium hydroxide may be at least one selected from the group consisting of Tetramethylammonium Hydroxide (TMAH), Tetraethylammonium Hydroxide (TEAH), and Tetrabuthylammonium Hydroxide (TBAH).

The sugar alcohol may prevent the source/drain regions SD from being etched or damaged by the basic compound. As an example, the sugar alcohol may be combined with the source/drain regions SD to form a chelate protecting the source/drain regions SD against the basic compound. The sugar alcohol may be at least one selected from the group consisting of, for example, sorbitol, glycerol, erythritol, threitol, arabitol, xylitol, ribitol, mannitol, galactitol, fucitol, iditol, inositol, volemitol, maltitol, lactitol, maltotritol, maltotetraitol, and polyglycitol.

The first etchant EC1 may further include an amine compound. The amine compound may be one of primary amines, secondary amines, or tertiary amines. The amine compound may be combined with the sugar alcohol to allow the first etchant EC1 to etch a polysilicon layer at a predetermined or increased etch rate. As an example, the amine compound may be methylamine, diglycolamine, trithylamine, n-ethylmethylamine, diethylenetriamine, n-ethyldietanolamine, n-dimethylhydroxylamine, n-octylamine, ethanolamine, dimethylamine, methylethanolamine, diphenylamine, trimethylamine, or triphenylamine.

In some embodiments, the amine compound may be a compound represented by the following chemical formula 1.

[Chemical Formula 1]

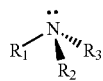

In the chemical formula 1, $R_1$ may be selected from the group consisting of a C1-C10 alkyl group and a C6-C8 aryl group, and each of $R_2$ and $R_3$ may be independently selected from the group consisting of hydrogen, a C1-C10 alkyl group, and a C6-C8 aryl group.

In the first etchant EC1, for every 100 parts by weight of the basic compound, the sugar alcohol may be present in an amount ranging from 0.1 to 10 parts by weight and the amine compound may be present in an amount ranging from 0.1 to 10 parts by weight. In some embodiments, the sugar alcohol may be present in an amount ranging from 5 to 10 parts by weight, and the amine compound may be present in an amount ranging from 5 to 10 parts by weight. In the case where the amount of the sugar alcohol or the amine compound is higher than 10 parts by weight, the content of the basic compound may be decreased and this may lead to a reduction in etch rate of a polysilicon layer. In the case where it is necessary to etch a polysilicon layer at a higher etch rate, the sugar alcohol may be present in an amount ranging from 0.1 to 5 parts by weight and the amine compound may be present in an amount ranging from 0.1 to 5 parts by weight. In some embodiments, the sugar alcohol may be present in an amount ranging from 0.1 to 3 parts by weight, and the amine compound may be present in an amount ranging from 0.1 to 3 parts by weight.

The first etchant EC1 may be prepared by adding and mixing water (e.g., deionized water) with an etchant mixture of the basic compound, the sugar alcohol, and the amine compound. For example, water (e.g., deionized water) may be added and mixed with an etchant mixture that has the desired ratios of the basic compound, the sugar alcohol, and the amine compound. Temperature of the added water may range from 60° C. to 100° C. The addition of water may be performed to control a final temperature and a pH value of the first etchant EC1. For example, as a result of the addition of water, the first etchant EC1 may have a temperature of 50° C. to 90° C. and a pH value of 12 to 14. A ratio in weight of the added water to the etchant mixture may range from 0.1 to 10, and this ratio may be changed in consideration of a desired temperature and a desired pH value.

If the etchant mixture is directly heated without the step of adding and mixing water having a temperature in the range of 60° C. to 100° C., the basic compound (e.g., $NH_4OH$) may evaporate due to its high volatility. By contrast, in the case where a large amount of water having a temperature in the desired range (e.g., 60° C. to 100° C.) is added in and mixed with the etchant mixture, it is possible to increase the temperature of the first etchant EC1 to a desired temperature (e.g., about 80° C.) without evaporation of the basic compound.

Referring back to FIG. 8, when the sacrificial gate patterns 106 are removed, constituents of the first etchant EC1 may infiltrate into the source/drain regions SD adjacent to the sacrificial gate patterns 106. The constituents of the first etchant EC1 may pass through the gate spacers 125 and may be diffused into the source/drain regions SD. In certain cases, pin-holes PinH may be formed when the gate spacers 125 are damaged during the first wet etching process WE1, and the constituents of the first etchant EC1 may infiltrate into the source/drain regions SD through the pin-holes PinH. However, modifying the wet etchant to include sugar alcohol may make it possible to protect the source/drain regions SD against the basic compound. For example, modifying the wet etchant to include sugar alcohol may prevent the formation of pin-holes PinH caused by damage to the gate spacers 125. According to experimental examples to be described below, in the case where sugar alcohol is contained in the first etchant EC1, it is possible to suppress or prevent the source/drain regions SD (e.g., made of doped Si or doped SiGe) from being damaged.

FIG. 9 illustrates a process of removing the sacrificial gate patterns 106 using a second etchant EC2, which is different from the first etchant EC1 of FIG. 8. Referring to FIG. 9, a second wet etching process WE2 may be performed on the exposed portions of the sacrificial gate patterns 106. For example, the second wet etching process WE2 may include providing a second etchant EC2 on the sacrificial gate patterns 106. The second etchant EC2 may be selected to allow the sacrificial gate patterns 106 (e.g., polysilicon) to be selectively etched by a wet etching process therewith.

The second etchant EC2 may be prepared in such a way that it contains the basic compound described with reference to FIG. 8. However, unlike the embodiments described in connection with FIG. 8, the sugar alcohol and the amine compound may not be contained in the second etchant EC2. The second etchant EC2 may be prepared by adding and mixing water (e.g., deionized water) with the basic compound. In the final stage of the preparation, the second etchant EC2 may have a temperature ranging from 50° C. to 90° C. and a pH value ranging from 12 to 14, similar to the case of the first etchant EC1.

When the sacrificial gate patterns 106 are removed, constituents (e.g., the basic compound) of the second etchant EC2 may infiltrate into the source/drain regions SD. The basic compound of the second etchant EC2 may be diffused into the source/drain regions SD or may infiltrate into the source/drain regions SD through the pin-holes PinH of the gate spacers 125. In this case, the source/drain regions SD may be etched by the basic compound, and thus, defects DE may occur in the source/drain regions SD. The defects DE may lead to deterioration in electric characteristics of a semiconductor device and a reduction in yield.

In experimental examples, etchant mixtures (i.e., Samples 1 to 17) of various compositions were prepared. Table 1 shows constituents of the etchant mixtures and their mixing ratios.

TABLE 1

| Experimental Samples | Constituents | Weight Percentage |
|---|---|---|
| Sample 1 | NH$_4$OH | 100 |
| Sample 2 | NH$_4$OH/Alcohol | 99:1 |
| Sample 3 | TMAH/Alcohol | 99:1 |
| Sample 4 | NH$_4$OH/Alcohol/Amine1 | 96:1:3 |
| Sample 5 | NH$_4$OH/Alcohol/Amine2 | 96:1:3 |
| Sample 6 | NH$_4$OH/TMAH/Alcohol/Amine1 | 48:48:1:3 |
| Sample 7 | NH$_4$OH/Alcohol/Amine3 | 96:1:3 |
| Sample 8 | NH$_4$OH/Alcohol/Amine1/Amine4 | 93:1:3:3 |
| Sample 9 | NH$_4$OH/Alcohol/Amine1 | 96:1:3 |
| Sample 10 | NH$_4$OH/Alcohol/Amine1 | 97:1:2 |
| Sample 11 | NH$_4$OH/Alcohol/Amine1 | 95:2:3 |
| Sample 12 | NH$_4$OH/Alcohol/Amine1 | 96:1:3 |
| Sample 13 | NH$_4$OH/Alcohol/Amine1/Acetic Acid | 86:1:3:10 |
| Sample 14 | NH$_4$OH/Alcohol | 97:3 |
| Sample 15 | NH$_4$OH/Alcohol | 94:6 |
| Sample 16 | NH$_4$OH/Alcohol | 91:9 |
| Sample 17 | NH$_4$OH/Amine1 | 50:50 |

In Table 1, the basic compound was ammonium hydroxide (NH4OH) and/or tetramethyl ammonium hydroxide (TMAH). The Alcohol was Sorbitol, the Amine 1 was n-Octylamine, the Amine 2 was Methylamine, the Amine 3 was Diglycolamine, and the Amine 4 was Triethylamine.

Each of the prepared etchant mixtures was mixed with about 80° C. deionized water, whose weight is four times that of each etchant mixture. In the final stage, each of the etchants was prepared to have a temperature of about 70° C.

In addition, a silicon wafer with a poly-silicon layer, a silicon wafer with a SiGe layer, and a silicon wafer with a doped silicon layer were prepared. In experiments, each of the prepared etchants was supplied onto the prepared wafers, and then, etch rates of the poly-silicon layer and damages to the SiGe and doped-silicon layers were measured and observed. Table 2 summarizes the results measured or observed in the experiments.

TABLE 2

| Experimental Samples | Poly Si Etch Rate (Å/min) | SiGe Protection | Doped Si Protection |
|---|---|---|---|
| Sample 1 | 449 | Not Good | Excellent |
| Sample 2 | 219 | Excellent | Excellent |
| Sample 3 | 600 | Very Good | Very Good |
| Sample 4 | 510 | Excellent | Excellent |
| Sample 5 | 83 | Excellent | Not Good |
| Sample 6 | 433 | Excellent | Good |
| Sample 7 | 227 | Excellent | Not Good |
| Sample 8 | 111 | Excellent | Excellent |
| Sample 9 | 370 | Excellent | Very Good |
| Sample 10 | 496 | Excellent | Excellent |
| Sample 11 | 420 | Excellent | Very Good |
| Sample 12 | 510 | Excellent | Excellent |
| Sample 13 | No Data | Not Good | No Data |
| Sample 14 | 143 | Excellent | Excellent |
| Sample 15 | 91 | Excellent | Excellent |
| Sample 16 | 40 | Excellent | Excellent |
| Sample 17 | 112 | No Data | No Data |

As shown in Table 2, the use of the etchants without the sugar alcohol (i.e., Sorbitol) (e.g., of Samples 1 and 17) led to damage of the SiGe and/or doped-silicon layers. By contrast, when the etchants containing the sugar alcohol (in these examples, Sorbitol) (e.g., of Samples 2 to 16) were used, the damage of the SiGe and/or doped-silicon layers was suppressed or prevented in general (except Samples 5, 7 and 13).

When the etchants containing the basic compound (e.g., NH$_4$OH or TMAH) and the sugar alcohol (i.e., Sorbitol) without amine compound (e.g., of Samples 2, 3, 14, 15, and 16) were used, the polysilicon etch rates were relatively low (except Sample 3). In some embodiments, in particular, an increase in content of Sorbitol led to a reduction in etch rate of the polysilicon layer. By contrast, when the amine compound was further contained in the etchants (e.g., of Samples 4 to 12), the polysilicon etch rates were generally good (except Sample 5).

In some embodiments, the etchant added with tertiary amine compound (e.g., Triethylamine) (e.g., of Sample 8) had the relatively low polysilicon etch rate, and the etchant added with Diglycolamine (e.g., of Sample 7), whose substituent was not an alkyl group, had the relatively low polysilicon etch rate. However, the etchants added with n-Octylamine having a long chained alkyl group (e.g., of Samples 4, 6, and 9 to 12) had high polysilicon etch rates and allowed the SiGe and doped silicon layers to be protected against etch damage. For example, in the case where, in the amine compound of the chemical formula 1, $R_1$ is selected from the C1-C10 alkyl group and each of $R_2$ and $R_3$ is hydrogen, it is possible to efficiently perform a wet etching process on the sacrificial gate patterns 106.

Meanwhile, in the case where an acetic acid was added in the etchant (e.g., of Sample 13), the etchant had a low pH value and a very low polysilicon etch rate.

For example, unlike the case of using the second etchant EC2 (e.g., Sample 1), in the case where the first etchant EC1 (e.g., Samples 2 to 12 and 14 to 16) according to some exemplary embodiments is used, it is possible to prevent the source/drain regions SD from being damaged when the sacrificial gate patterns 106 are removed. As a result, the use of the first etchant EC1 may contribute to an improved production yield of a semiconductor device.

Figure 10A:
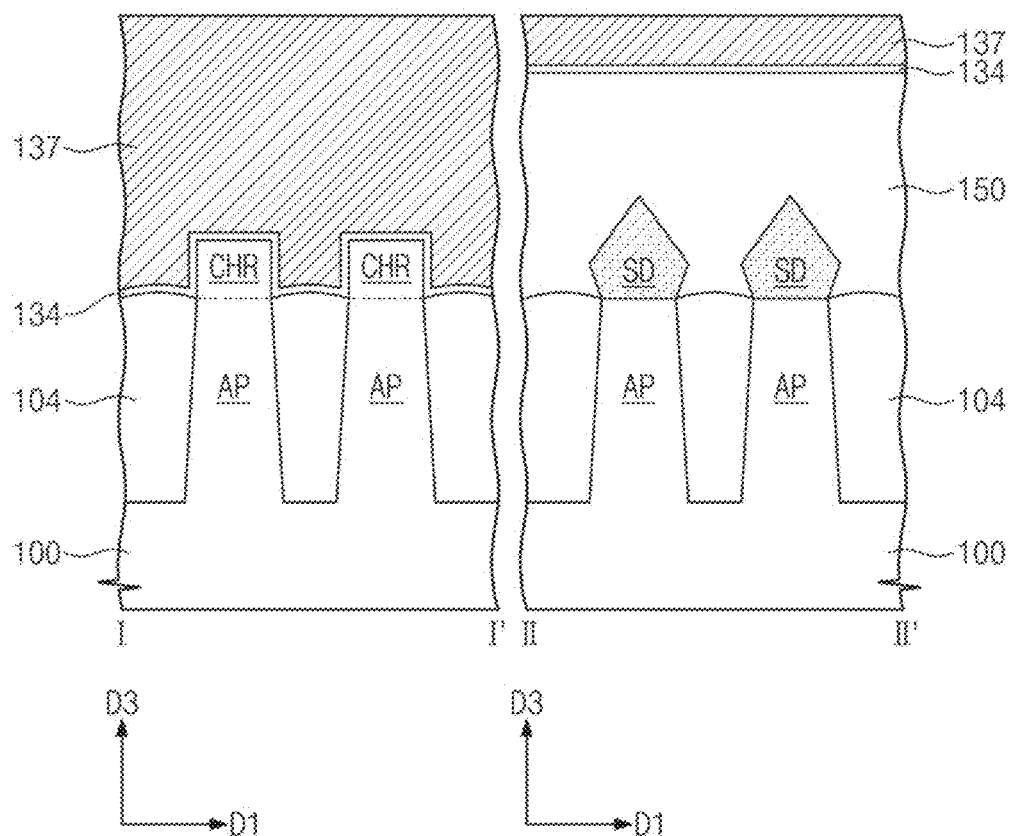
Figure 10B:
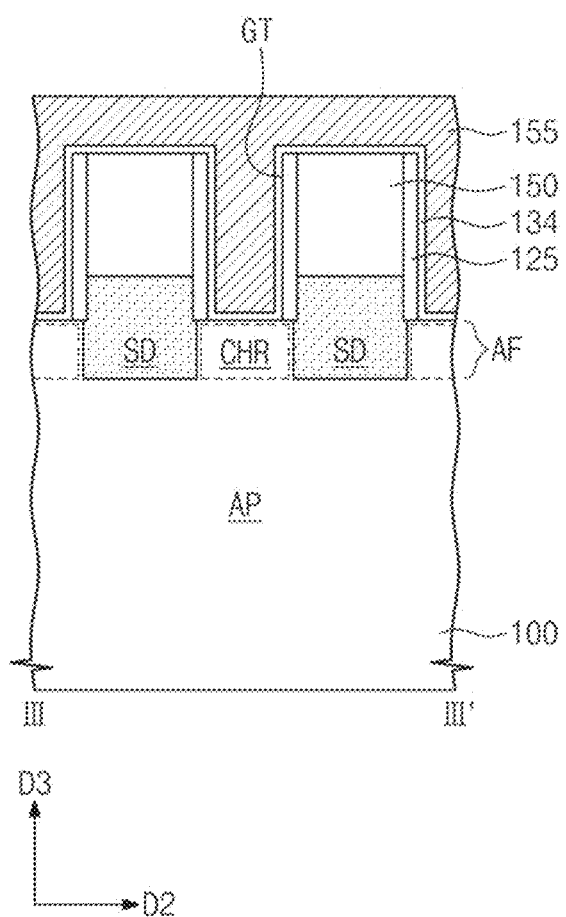

Referring to FIGS. 2, 10A, and 10B, the gate dielectric layer 134 may be formed to partially fill the gate trenches GT. The gate dielectric layer 134 may be conformally formed to partially, but not completely, fill the gate trenches GT. For example, the gate dielectric layer 134 may be formed by an atomic layer deposition (ALD) process or a chemical vapor deposition (CVD) process. The gate dielectric layer 134 may be formed of or include a high-k dielectric material, and the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A conductive layer 137 may be formed on the gate dielectric layer 134 to completely fill the gate trenches GT. The conductive layer 137 may include at least one of conductive metal nitride materials (e.g., titanium nitride or tantalum nitride) or metallic materials (e.g., titanium, tantalum, tungsten, copper or aluminum). In some embodiments, the conductive layer 137 may be formed by a deposition process (e.g., CVD or sputtering).

Figure 11A:
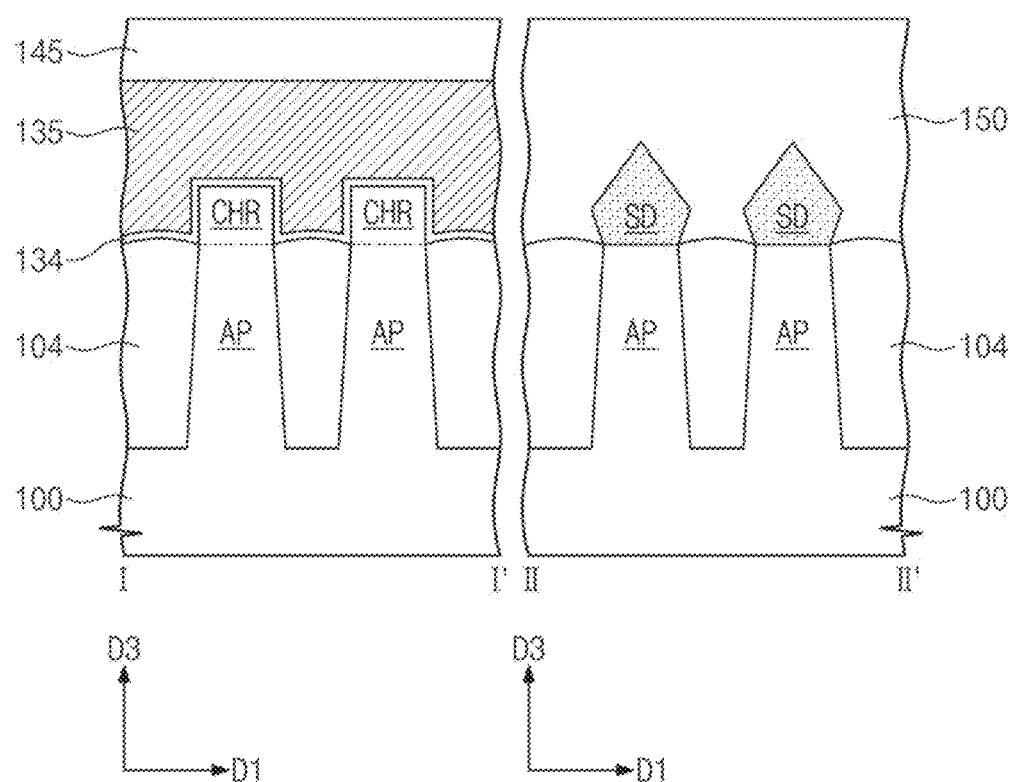
Figure 11B:
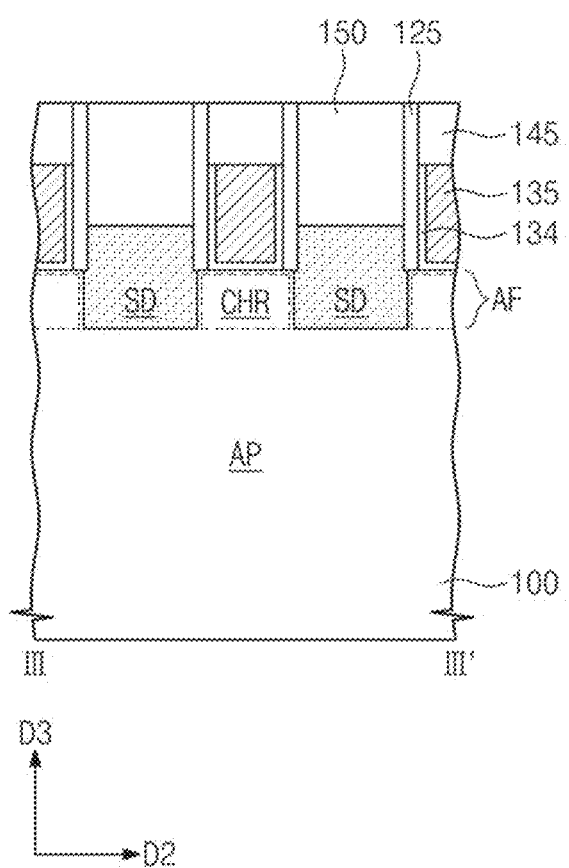

Referring to FIGS. 2, 11A, and 11B, the conductive layer 137 may be recessed to form the gate electrode 135 partially filling each of the gate trenches GT. For example, a planarization process may be performed on the conductive layer 137 and the gate dielectric layer 134 to expose the top surface of the first interlayered insulating layer 150. Accordingly, the gate dielectric layer 134 and the conductive layer 137 may be locally formed in each of the gate trenches GT. For example, after the planarization process is performed, the gate dielectric layer 134 and the conductive layer 137 formed in one of the gate trenches GT may be physically separate from the gate dielectric layers 134 and the conductive layers 137 formed the other gate trenches GT. The planarization process on the conductive layer 137 and the gate dielectric layer 134 may include a CMP process.

Thereafter, an upper portion of the conductive layer 137 may be recessed, and accordingly, the gate electrodes 135 may be formed in each of the respective gate trenches GT. The recessing of the conductive layer 137 may include a process of selectively etching the conductive layer 137. As a result of the etching process, the gate electrodes 135 may be formed to have top surfaces lower than the top surface of the first interlayered insulating layer 150. In some embodiments, the etching process may be performed to remove a portion of the gate dielectric layer 134 positioned at a higher level than the top surface of the gate electrode 135. As a result, the gate dielectric layer 134 may be interposed between the gate electrode 135 and the gate spacers 125. The gate dielectric layer 134 and the gate electrode 135 may extend lengthwise in the first direction D1.

Next, the gate capping layers 145 may be formed to cover the recessed top surfaces of the gate electrodes 135. The gate capping layers 145 may be formed to completely fill gap regions formed by recessing the gate electrodes 135. The gate capping layers 145 may be formed of a material having an etch selectivity with respect to the first interlayered insulating layer 150 and the second interlayered insulating layer 155. For example, the gate capping layers 145 may be formed of or include at least one of SiON, SiCN, SiCON, or SiN. The gate capping layers 145 may be formed, for example, by an atomic layer deposition (ALD) process, a plasma-enhanced chemical vapor deposition (PECVD) process, or a high-density plasma chemical vapor deposition (HDPCVD) process.

Referring back to FIGS. 2, 3A, and 3B, the second interlayered insulating layer 155 may be formed on the first interlayered insulating layer 150 and the gate capping layers 145. The second interlayered insulating layer 155 may be formed of or include a silicon oxide layer or a low-k oxide layer. The low-k oxide layer may include, for example, a carbon-doped silicon oxide layer (e.g., SiCOH). The second interlayered insulating layer 155 may be formed by a CVD process.

Thereafter, contact holes may be formed to penetrate the second interlayered insulating layer 155 and the first interlayered insulating layer 150 and expose the source/drain regions SD. As an example, the contact holes may be formed in a self-aligned manner by the gate capping layers 145 and the gate spacers 125. For instance, the contact holes may be formed between adjacent align pairs of the gate capping layers 145 and the gate spacers 125.

Although not shown, metal silicide layers may be formed on the source/drain regions SD exposed by the contact holes. The metal silicide layers may include at least one of titanium silicide, tantalum silicide, or tungsten silicide.

Next, the contacts CA may be respectively formed in the contact holes to be in contact with the metal silicide layers. Each of the contacts CA may include a conductive pillar CP and a contact barrier layer BL enclosing the conductive pillar CP. In detail, the contact barrier layer BL may be formed to partially fill the contact holes. For example, the contact barrier layer BL may be formed cover the interior sidewalls of the contact holes. Thereafter, a conductive layer may be formed to completely fill the contact holes, and a planarization process may be performed to expose the top surface of the second interlayered insulating layer 155. For example, the conductive layer may fill the remaining portion of the contact holes on the interior of the contact barrier layer BL. The contact barrier layer BL may include a metal nitride layer (e.g., Ti/TiN), and the conductive layer may include a metallic material (e.g., tungsten).

According to some exemplary embodiments, an etching method may be performed using an etchant capable of selectively etching a polysilicon layer and preventing neighboring regions from being damaged. Accordingly, it is possible to prevent source/drain regions from being damaged in a wet etching process and consequently to improve production yield of a semiconductor device.

While some exemplary embodiments have been particularly shown and described, it will be understood by one of ordinary skill in the art that variations in form and detail may be made therein without departing from the spirit and scope of the attached claims.

What is claimed is:

1. A method of manufacturing a semiconductor device, comprising:
supplying an etchant on an etch-target layer on a semiconductor substrate to etch the etch-target layer with a wet etch process,
wherein the etchant comprises a basic compound and a sugar alcohol,
wherein the basic compound comprises ammonium hydroxide or tetraalkyl ammonium hydroxide,
wherein, in the etchant, the sugar alcohol has 0.1 to 10 parts by weight for every 100 parts by weight of the basic compound, and
wherein the etchant further comprises a compound that has 0.1 to 10 parts by weight for every 100 parts by weight of the basic compound and is represented by the following chemical formula 1:

[Chemical Formula 1]

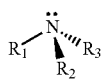

wherein R₁ is selected from the group consisting of a C1-C10 alkyl group and a C6-C8 aryl group, and wherein each of R₂ and R₃ is independently selected from the group consisting of hydrogen, a C1-C10 alkyl group, and a C6-C8 aryl group.

2. The method of claim 1, wherein the etch-target layer is polysilicon.

3. The method of claim 1, wherein the sugar alcohol is at least one selected from the group consisting of sorbitol, glycerol, erythritol, threitol, arabitol, xylitol, ribitol, mannitol, galactitol, fucitol, iditol, inositol, volemitol, maltitol, lactitol, maltotritol, maltotetraitol, and polyglycitol.

4. The method of claim 1, wherein the etchant is prepared by:
mixing the basic compound with the sugar alcohol to prepare an etchant mixture; and
mixing the etchant mixture with water of 60-100° C.

5. A method of fabricating a semiconductor device, comprising:
forming a device isolation layer on a substrate to define an active pattern;
forming a sacrificial gate pattern that crosses over the active pattern; and
replacing the sacrificial gate pattern with a gate electrode,
wherein the replacing of the sacrificial gate pattern with the gate electrode comprises supplying an etchant on the sacrificial gate pattern to etch the sacrificial gate pattern using a wet etch process,
wherein the etchant comprises a basic compound, a sugar alcohol, and a compound represented by the following chemical formula 1, and
wherein the basic compound comprises ammonium hydroxide or tetraalkyl ammonium hydroxide, and
wherein the compound of the etchant is represented by the following chemical formula 1:

[Chemical Formula 1]

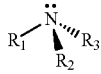

where R₁ is selected from the group consisting of a C1-C10 alkyl group and a C6-C8 aryl group, and each of R₂ and R₃ is independently selected from the group consisting of hydrogen, a C1-C10 alkyl group, and a C6-C8 aryl group.

6. The method of claim 5, wherein the sacrificial gate pattern comprises polysilicon.

7. The method of claim 5, wherein, in the etchant, for every 100 parts by weight of the basic compound, the sugar alcohol has 0.1 to 10 parts by weight and the compound of the chemical formula 1 has 0.1 to 10 parts by weight.

8. The method of claim 5, wherein the etchant has a pH value ranging from 12 to 14.

9. The method of claim 5, wherein the tetraalkyl ammonium hydroxide is at least one selected from the group consisting of Tetramethylammonium Hydroxide (TMAH), Tetraethylammonium Hydroxide (TEAH), and Tetrabuthylammonium Hydroxide (TBAH).

10. The method of claim 5, wherein the sugar alcohol is at least one selected from the group consisting of sorbitol, glycerol, erythritol, threitol, arabitol, xylitol, ribitol, mannitol, galactitol, fucitol, iditol, inositol, volemitol, maltitol, lactitol, maltotritol, maltotetraitol, and polyglycitol.

11. The method of claim 5, wherein in the chemical formula 1, R₁ is the C1-C10 alkyl group and each of R₂ and R₃ is hydrogen.

12. The method of claim 5, further comprising:
forming a pair of spacers to cover both sidewalls of the sacrificial gate pattern; and
covering the active pattern and the spacers with an interlayer insulating layer,
wherein the replacing of the sacrificial gate pattern with the gate electrode further comprises:
performing a wet etching process on the sacrificial gate pattern to form a gate trench defined by the spacers; and
forming a gate electrode to fill the gate trench.

13. The method of claim 12, further comprising forming source/drain regions in portions of the active pattern at both sides of the sacrificial gate pattern, before the forming the interlayer insulating layer,
wherein the performing a wet etching process does not etch the source/drain regions.

14. The method of claim 5, wherein the active pattern comprises an active fin protruding above a device isolation layer.

15. A method for manufacturing an etchant, comprising:
mixing a basic compound with a sugar alcohol to prepare an etchant mixture; and
mixing the etchant mixture with deionized water, wherein the deionized water is in the range of 60-100° C.,
wherein the basic compound comprises ammonium hydroxide or tetraalkyl ammonium hydroxide, and
wherein, in the etchant, the sugar alcohol has 0.1 to 10 parts by weight for every 100 parts by weight of the basic compound.

16. The method of claim 15, wherein the sugar alcohol is at least one selected from the group consisting of sorbitol, glycerol, erythritol, threitol, arabitol, xylitol, ribitol, mannitol, galactitol, fucitol, iditol, inositol, volemitol, maltitol, lactitol, maltotritol, maltotetraitol, and polyglycitol.

17. The method of claim 15, wherein the etchant further comprises a compound that has 0.1 to 10 parts by weight for every 100 parts by weight of the basic compound and is represented by the following chemical formula 1:

[Chemical Formula 1]

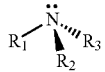

wherein R₁ is selected from the group consisting of a C1-C10 alkyl group and a C6-C8 aryl group, and wherein each of R₂ and R₃ is independently selected from the group consisting of hydrogen, a C1-C10 alkyl group, and a C6-C8 aryl group.

18. The method of claim 15, wherein the etchant has a pH value ranging from 12 to 14.

* * * * *